(12) United States Patent
Wirth

(10) Patent No.: US 8,054,124 B2
(45) Date of Patent: Nov. 8, 2011

(54) PROGRAMMABLE ELECTRONICS

(75) Inventor: Peter Wirth, Eching (DE)

(73) Assignee: ASM Automation Sensorik Messtechnik GmbH, Moosinning (DE)

( * ) Notice: Subject to any disclaimer, the term of this patent is extended or adjusted under 35 U.S.C. 154(b) by 288 days.

(21) Appl. No.: 12/321,108

(22) Filed: Jan. 15, 2009

(65) Prior Publication Data

US 2009/0184750 A1 Jul. 23, 2009

(30) Foreign Application Priority Data

Jan. 15, 2008 (DE) .......................... 10 2008 004 455

(51) Int. Cl.
*H01H 37/76* (2006.01)

(52) U.S. Cl. ........................................ 327/525; 327/540

(58) Field of Classification Search .................. 327/525, 327/540, 541
See application file for complete search history.

(56) References Cited

U.S. PATENT DOCUMENTS 6,437,959 B1 8/2002 Andrieu et al.
7,446,593 B2 * 11/2008 Kilian et al. .................. 327/525

* cited by examiner

*Primary Examiner* — Jeffrey Zweizig
(74) *Attorney, Agent, or Firm* — Head, Johnson & Kachigian, P.C.

(57) ABSTRACT

An electronic device with polarity reversal protected connections and irreversibly interruptible programming connections, wherein the interruption is performed through safety elements provided in the programming paths, behind which safety elements diodes are disposed which block towards ground in normal operation, so that an overload current can be passed through the safety elements and through the diodes to ground through intentional polarity reversal of the respective connections, whereby the safety elements are destroyed and the programming conductors are irreversibly interrupted.

12 Claims, 2 Drawing Sheets

PROGRAMMABLE ELECTRONICS

I. AREA OF APPLICATION

Figure 1:
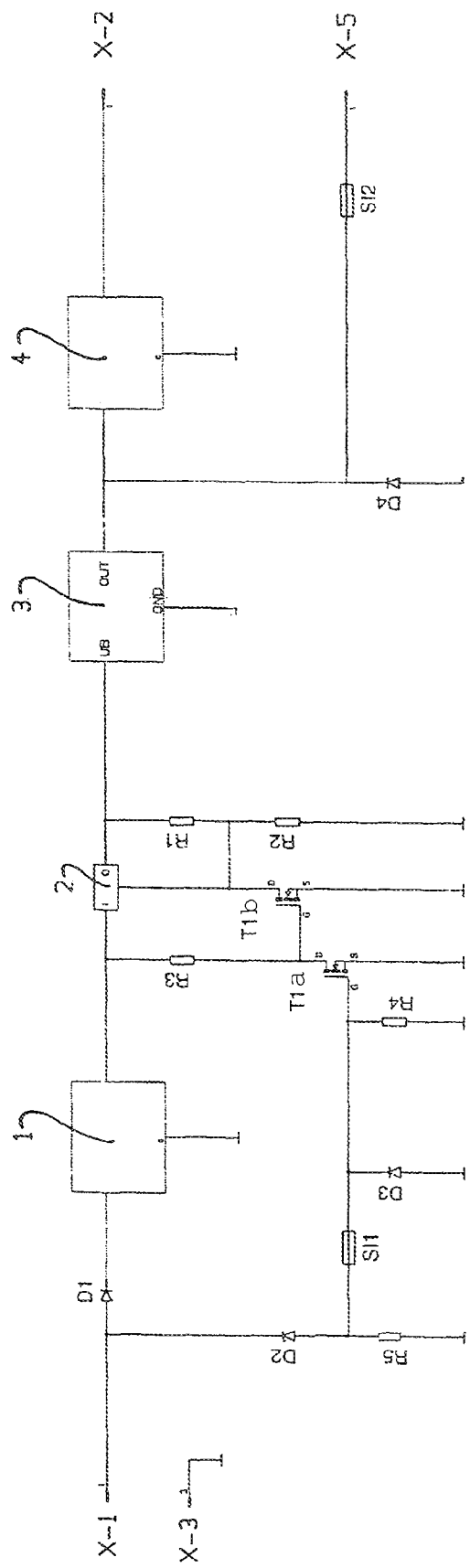

The present invention relates to an irreversibly interruptible programming connection, to an electronic device comprising such connection and to a method for interrupting such programming connection.

II. TECHNICAL BACKGROUND

The present invention is preferably used for programming sensors, e.g. position sensors for adjusting operating parameters like start value and end value, zero point and measurement range, resolution, linearization data sets, scan rates, filter parameters etc. The programming of such parameters is generally only done once in the product life cycle. Sensors in particular should already have gone through final assembly before programming, thus should be completely installed in the housing and should possibly be encapsulated by an encasement compound.

In the prior art programming conductors have been used in such cases for programming sensors, which conductors were run out to separate terminals, this means connector pins or strands in a connection wire. In many cases, this technique is the most cost effective method. Thus, in the prior art, in addition to the application signals, thus those conductors, which are required for operating the sensor during regular operation, like e.g. +24 V supply, 0 V supply (ground), OUT=analog signal output, 0 V signal (signal ground) are provided. Thus, in the prior art, additional programming conductors (like e.g. progmode as an activation signal of the programming mode and progsignal as a bidirectional serial programming data signal) were run out. In many cases, these programming conductors are used only once during the production process for adjusting e.g. the zero-point and the amplification of a position sensor or of an angle sensor. After shipping the sensor, access through the programming conductors is not necessary anymore or not even desired or permissible anymore. Though, these programming conductors are being used only once in the product life cycle, they, however, also have to comply with the requirements for reverse polarity- and overvoltage resistance. In order to exclude the risk of damaging the internal electronics by accidental electric potentials, this requires a considerable additional complexity of the circuit through current- or voltage limiting components, like e.g. varistors, transzorbdiodes, and cold conducting resistors.

III. DESCRIPTION OF THE INVENTION a) Technical Object

Based on this prior art, it is the object of the present invention to make such programming conductors irreversibly interruptible and to provide an electronic device with such irreversibly interruptible programming conductors, and eventually, to provide suitable methods for an irreversible interruption of such programming connections.

b) Solution

This object is accomplished by the characterizing features of patent claims 1, 2, 6, 10, 14 and 15. Advantageous embodiments can be derived from the dependent claims.

In order to accomplish the object, the present invention is based on the precondition that the connections at electronic devices relevant in this context, like e.g. sensors for the so-called application signals have to be provided with polarity reversal safety, or have to be loadable with a negative voltage to some extent. Based on that, it is the core idea of the present invention to be able to irreversibly interrupt a connection, when the connection is run through an irreversibly destructible component, thus through a safety element, and that an increased current load can be run through said safety element for irreversible interruption.

The present invention has thus recognized for the first time that such an overload is possible without damaging the electronic device, when the connection for irreversible interruption is intentionally connected with reverse polarity, and the overvoltage is conducted to ground through a diode with sufficient current capability, which is disposed directly behind the safety element, so that only the relatively small voltage drop is applied to a diode in pass-through direction in the internal electronics of the device with the wrong polarity. Said voltage drop is mostly significantly below 1 V. Thus, the diode has to be poled so that it blocks in the normal operating polarity of the connection and only becomes conductive, when the polarity of the connection is reversed. Thus, at the same time, said diode can form a suitable polarity reversal protection for the irreversibly interruptible connection.

c) Embodiments

Figure 2:
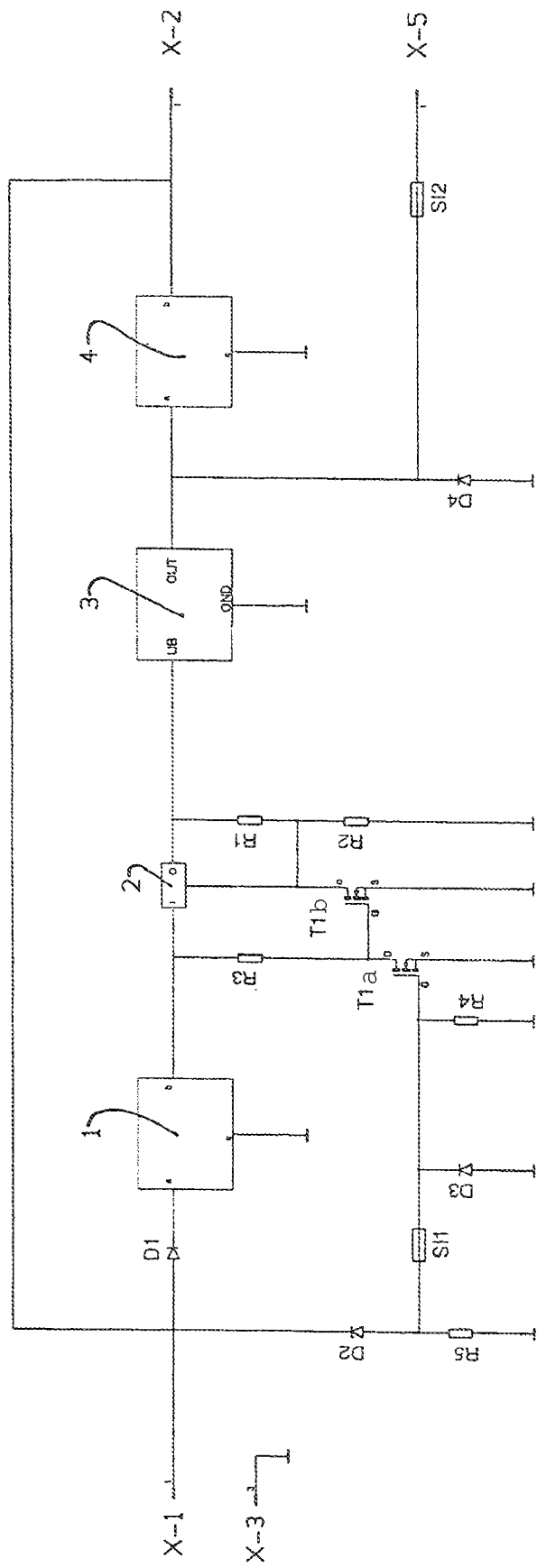

Embodiments according to the invention are subsequently described in more detail in an exemplary manner in the appended figures, wherein:

FIG. 1: shows an embodiment of the present invention, in which the switching of the sensor into the programming mode is performed through an increase of the supply voltage; and FIG. 2: shows an embodiment of the invention, in which a switching of the sensor into programming mode is performed by applying a voltage to the output.

FIG. 1 shows an embodiment of the present invention with a programmable sensor with four exterior connection, wherein the connection X1 is used for the supply voltage and is also used for switching into programming mode, when an increased supply voltage is applied. The connection X2 supplies the output signal of the sensor, the connection X3 delivers the ground connector and the connection X5 is used for applying serial signals for programming the sensor. Thus, for the present invention, it is not relevant what sensor (angle, distance, temperature or other measurement values) is being used.

Since external supply voltages of up to 40 V should be permissible in the present case, the supply voltage connection X1 is initially connected to the input of a primary power supply circuit 1 through a polarity reversal diode D1 connected in pass-through direction. The output of the primary power supply circuit 1 is connected to the actual internal voltage regulator 2. The internal voltage regulator regulates the voltage, which has only been roughly reduced by the primary power supply circuit 1, to an exact voltage of 5V, when its additional connection is directly connected to ground. The output of the internal voltage controller 2 is then connected to the supply voltage input UB of the actual sensor circuit 3. Its output is connected, on the one hand, to the output driver 4 and, on the other hand, to the programming data input X5 (Progserial). The output of the output driver circuit 4 is connected directly to the output connection X2.

The sensor circuit 3 is thus configured, so that the data for said sensor circuit 3 can be read into the internal memory of the sensor circuit 3 through applying a suitable voltage to the output connection OUT of the sensor circuit 3, when the operating voltage UB has been increased from 5V to 7.5V. Thus, the programming of the actual sensor circuit 3 is performed in the same manner:

The supply voltage at X1 is significantly increased, thereby also the voltage UB is increased as described subsequently, and then a respective programming can also be performed at X5 as described infra.

How is the increase of the voltage UB being performed then at the sensor circuit 3, since the internal voltage controller supplies a voltage of 5 V relative to ground at its output independently from the input voltage at its input?

For this purpose, the ground connector of the internal voltage controller 2 is conducted to ground through a transistor T1$b$. During normal operations, this transistor is conductive and the ground connection of the internal voltage controller 2 is therefore connected to 0 as it is typical. In order to perform a programming of the sensor circuit 3, thus the transistor T1$b$ has to be switched to blockage. Then, the "ground connection" of the internal voltage controller is connected to the center connection of the voltage divider between the operating voltage UB and ground, which voltage divider is formed by the resistors R2 and R1. For this purpose, the "ground connection" of the internal voltage controller 2 is also connected to the connection between the resistors R2 and R1.

Thus, when the transistor T1$b$ blocks, the imaginary ground point of the internal voltage controller 2 is increased by the voltage drop occurring over R2, and the internal voltage controller 2 controls the voltage UB to 5V plus the voltage drop over R2.

In order to accomplish this, the transistor T1$b$ has to be conductive during normal operations, this is accomplished by connecting the control connection G of the transistor T1$b$ through R3 to the operating voltage reduced by the primary power supply 1. In order to be able to switch into programming mode, it has to be possible to switch the transistor T1$a$ conductive, whereby the transistor T1$b$ is blocked. For this purpose, the control input G of the transistor T1$a$ is connected to the control voltage input X1 of the entire sensor circuit. The switchpoint of the transistor T1$a$ is set by a Zenerdiode with a Zenervoltage of e.g. 24 V. The resistor R4 is also connected to the control input of the transistor T1$a$ against ground. The transistor T1$a$ blocks when the supply voltage is less than the Zenervoltage of 24 V and becomes conductive when the supply voltage is greater than approximately 26 V.

According to the invention, it shall be accomplished now that the programming can be irreversibly performed, this means, it shall be assured after the programming and the checking has been performed that a switching of said entire sensor circuit into the programming mode is not possible anymore. According to the invention, thus an element, which can be destroyed by overload, e.g. a safety element or a safety resistor Si1 is disposed in the connection between X1 and the control input G of the transistor T1$a$. In order to be able to destroy said element Si1, a very high current has to be put through it. According to the invention, a suitable path for said current is provided by connecting a diode D3 to ground between the destructible element Si1 and the control input G of the transistor T1$a$, which diode blocks under a normal polarity of the connection X1. The combination of the element Si1 and of the diode D3 connected thereafter, which goes directly to ground, now facilitates to send a very high current through the element Si1 and through the diode D3 to ground in a controlled manner, when the polarity of the supply voltage connection X1 is reversed relative to the normal polarity. This is certainly only possible when the connection of the element Si1 branches off between the supply voltage connection X1 and the polarity reversal protection diode D1. This is the case here as is evident from FIG. 1.

The value for R4 is to be configured e.g. with 10 k Ω, so that in blocked condition of the Zenerdiode D2, thus when the supply voltage is below the Zenervoltage of 24 V, the voltage supplied to R4 due to the leakage flow of the Zenerdiode remains below the switching point of the transistor T1$a$. R3 is configured with a high resistance, for example 100 k Ω, so that the transistor T1$b$ is also safely controlled when a leakage current of the switched off transistor T1$a$ occurs.

This now leads to the problem though, that the respective safety elements partially only allow an operating voltage, thus a blocking voltage of up to 32 V in cutoff condition. This restricts the voltage specification range of the supply conductor during its use, when one wishes to use respective safety elements with a very small configuration. The configuration 0204 with the dimensions 1.6×0.6 mm e.g. only comprises a maximum permissible blockage voltage of 32 V in separated condition. In order to prevent such a large voltage rise at the element Si1 in destroyed condition, the safety element Si1 is disposed after the Zenerdiode D2. Between the Zenerdiode D2 and the element Si1, a high resistance value resistor R5 branches off, by which the voltage drop at the diode D2 is maintained.

When the programming is to be made irreversible now, the supply voltage connection X1 is intentionally reversed. This does not damage the primary power supply 1, since it is protected by the polarity reversal protection diode D1. In this case, the entire current flows through the Zenerdiode D2, which is conductive under reverse polarity of the supply voltage connection, through the element Si1 and through the diode D3 to ground. Damaging the transistor T1$a$ is also excluded, since when the diode D3 is sized correctly, a voltage drop of maximally 1 V in the extreme occurs at said diode in pass-through direction. Thus, this way, the element Si1 can be destroyed in a controlled manner without damaging the rest of the circuit. When said element Si1 is interrupted, it is not possible anymore to switch the transistor T1$a$ conductive by applying an increased supply voltage to the connection X1, so that the transistor T1$b$ blocks and the output voltage of the internal voltage controller 2 is increased. Thus, the programming has become irreversible.

Now there still exists the problem that the programming data input connection X5 still leads into the circuit. In order to comply with the requirements made upon sensors, said connection would have to be made polarity reversal proof and overvoltage proof with a considerable additional complexity of the circuit, in order to exclude the risk of destruction of the internal electronics by accidentally imparted electrical potentials. For this purpose, current- or voltage limiting components, like e.g. varistors, transzorbdiodes, cold conducting resistors, etc. would have to be provided.

However, since the programming shall be irreversible anyhow after the programming of the sensor, the connection X5 can also be electrically separated from the internal circuit of the sensor while using the same circuit elements, so that the complexity of the protective circuitry can be omitted. For this purpose, another element Si2, which can be destroyed by overload, is provided directly after the connection X5. Between the element Si2 and the output OUT of the sensor 3, in turn, a diode D4 branches off to ground, which diode has a polarity so that it locks during normal operation of the connection X5.

Now, the connection X5 can be separated in the same way by destroying the element Si2 by running a strong current through the element Si2 through intentional polarity reversal of the connection X5, and by connecting the diode D4 to ground, which becomes conductive when the connection X5 is reversed in polarity. However, it is assured that neither the sensor 3 nor the output driver 4 can be damaged, since also here, in case of a polarity reversal, in turn, maximally the throughput voltage of the diode D4 can be applied to the output OUT of the sensor 3, and it can be held significantly below 1 V, when the diode D4 is selected appropriately.

As interruptible elements Si1, Si2, safety elements or safety resistors can be used. A safety element provides an irreversibly separable low resistance connection, whose response characteristics are determined by a specified current value, e.g. 0.25 A. In order to interrupt the safety element, thus, to destroy it, a current of e.g. 0.5 A then has to be supplied for 0.5 seconds.

A safety resistor constitutes an irreversibly separable connection, which simultaneously comprises a defined resistance value. The response characteristics are determined by a predetermined power value. In order to interrupt a safety resistor with a response power of e.g. 2 W and with a resistance value of 200Ω, a current of approximately 0.1 A at a voltage of 20 V has to be supplied for 0.5 seconds. The advantage with respect to the safety element thus is that the current, which has to be supplied for the purpose of interruption, is much lower. The loading of the diodes D3, D4 can thus be kept substantially lower, and thus, also a much lower negative parasite-voltage occurs at the sensor element, when the elements Si1, Si2 are destroyed by reversing the polarity of the respective connectors.

FIG. 2 shows an alternative embodiment of the present invention. Herein, the switching of the sensor circuit is not performed by increasing the supply voltage at X1 significantly above the previous value, but by applying a voltage to the output connection X2 of the resistor, which is provided through a low resistance resistor and which exceeds the normal operating range of e.g. 0.5 V to 10 V. This has the advantage that no voltages ever have to be applied to the circuit, which are higher than the specified supply voltage. In this case, the Zenerdiode D2 is simply not connected to the supply voltage connection X1, like illustrated in FIG. 1, but to the output connection X2. The Zenervoltage of the diode D2 is sized lower in this case, e.g. at 12 V, so that the output driver 4 is not unnecessarily loaded far outside of its operating range.

By the same token, certainly the Zenerdiode D2 and the connector resistor R5 to ground can be omitted in all cases in which safety elements Si1 are used, which comprise a sufficiently high separation voltage, thus operating voltage, in destroyed condition.

According to the invention, thus programming conductors are run out of a housing through terminals of the application plug-in connector X1 or X2, X5, or run out through strands in a supply connector. The programming conductors, however, are irreversibly interrupted after use, in order to avoid additional complexity for polarity reversal and overvoltage protection. By co-using one of the application signals X1 or x2, no separate programming conductor "progmode" has to be run out for switching into the programming mode. Only a conductor "progserial" has to be run out separately. The separation of the programming conductors is then performed by destroying the safety elements or safety resistors Si1 and Si2 by current overloading of said elements in case of a "wrong" polarity of the elements X1, X2 or X5.

When programming the operating parameters described supra, the issue is transferring data into the non-volatile memory of a sensor element 3. For shifting from normal operation into programming operation, it is required in such a sensor element 3 to increase the supply voltage UB of the sensor element 3 from 5 V to 7.5 V. Subsequently, the programming data is transmitted through another connection OUT of the sensor element. During normal operation, this connection is used for another function, e.g. used as an analogue primary position signal. Since the sensor element is often a component of an application circuit, the connections necessary for programming are initially not accessible from the outside.

The internal voltage controller 2 is thus provided with suitable circuitry, through which its output voltage O is switched from the voltage for normal operations, here e.g. 5 V, to a significantly increased voltage, here e.g. 7.5 V, for the programming mode of the sensor element 3. For switching, as described above, voltage divider resistors R1, R2 are switched by the transistors T1a, T1b into the back coupling path of the internal voltage controller. According to FIG. 1, this control path of the transistors T1a and T1b is connected through a safety element Si1 and through a Zenerdiode D2 to the voltage supply connection X1 of the sensor connector. Thus, in FIG. 1, e.g. through raising the sensor supply voltage of e.g. 24 V to approximately 40 V, the internal supply voltage of the sensor element 3 can be switched from 5 V to 7.5V. Thus, the sensor element 3 is disposed in programming mode. A separate connection for activating the programming mode is not required.

FIG. 2 shows an alternative embodiment of the invention, in which the control path of the transistors T1a and T1b after the Zenerdiode D2 is not connected to the supply voltage connection X1, but to the output connection X2 of the sensor plug-in connector. Thus, by imparting a voltage potential, which does not occur in normal operations, of e.g. −1 V or +12 V, the internal supply voltage of the sensor element 3 can be switched from 5 V to 7.5 V, and thus the programming mode is active. Also here, a separate connection for activating the programming mode is not necessary.

Now, the only thing that is still necessary is to run the programming data conductor "progserial" to a separate connection X5, which is not used during normal operation, of the sensor plug-in connector, or to run the programming data connector out through an additional strand of the sensor connection cable. Also this connection can be configured irreversibly separable as described above. According to the present invention, e.g. after programming the sensor element, the programming paths can be interrupted as follows:

The signal path "progmode", connected to the supply connection, leads from the connection contact X1 initially to a safety element Si1. After the safety element Si1, the cathode of a diode D3 is connected. The anode of the diode is connected with 0 V potential (ground). The ground is also run out on the connection X3 of the sensor plug connector. Also the programming data signal path "progserial" is provided with a safety element Si2 and with a diode D4. The safety elements Si1 and Si2 in these two paths can respectively be interrupted by applying a sufficiently large reverse polarity voltage against ground or by imparting a negative current running against the normal operating polarity. Thus, all programming conductors can be separated. An unintentional switching into the programming mode at a later point in time is thereby absolutely safely excluded. Instead of the safety elements, safety resistors can be used.

According to the invention, thus, the following programming procedure can be performed at the end of the manufacturing process of the sensors according to the invention:

1. Activate the programming mode by increasing the supply voltage at X1, or by applying a suitable voltage to the output X2.

2. Transmitting operating parameters through the connection X5.
3. Separating the sensor from the voltage supply and applying a negative auxiliary voltage to the supply conductor X1 or to the output X2, and to the connection X5 for separating the programming paths.

In summary, the present invention comprises the following advantages:

The programming paths are electrically separated, thus they are decoupled from the application specific signals (supply voltage or primary analog output signal), and thus do not have to be protected against overvoltage or unintentional reprogramming.

As long as the programming paths are not interrupted, a shift between programming mode and normal mode can be performed at will. Thus, the programming result can be respectively checked again and can possibly be improved in several steps. This is advantageous, if high precision and a linearized characteristic shall be accomplished, which cannot simply be accomplished in a single programming step. Thus, it is also advantageous to combine the programming device for the sensor and for a measurement system for checking the measuring precision in one unit, and to let the switching between "measurement" and "programming" run automatically. Thus, important parameters, like e.g. linearity or adjustment precision of measurement range, start value, end value, can be improved and optimized in several steps.

Only an additional connection X5 has to be run out. The switching into programming mode can be performed without additional contacts or connection conductors by adjusting a state, which is different from the normal state, at one of the application signals (X1 or X5), which are run out.

Through a suitable arrangement of a Zenerdiode D2, safety elements or safety resistors with low rated voltage and thus with substantially smaller size can be used.

The invention claimed is:

1. A programmable electronic device with at least one programming data connection (X5), which can be switched at will by increasing the operating voltage (UB) at least of a portion of the electronic device for taking over programming data, with an internal voltage controller (2), which generates the operating voltage (UB) from a higher supply voltage, and which is switchable for generating a higher operating voltage (UB) by applying a higher voltage to an also otherwise voltage carrying polarity reversal protected connection (X1), or by applying an external voltage to an output connection (X2), which is protected against polarity reversal, wherein the connection between the connection (X1) or the output connection (X2) and the internal voltage controller (2) leads through a destructible component (Si1), which is destructible by current overload, whose output at the voltage controller side is additionally connected to ground through a diode (D3), which has a polarity so that it blocks when the correct polarity voltage is applied to the connection (X1) or to the output connection (X2) wherein a Zener diode (D2) is disposed between the connection (X1) or the output connection (X2) and the destructible component (Si1), said Zener diode (D2) having a polarity, so that it blocks when a correct polarity voltage is applied to the connection (X1) or to the output connection (X2), and a very high value resistor (R5) branches off to ground between the Zener diode (D2) and the destructible component (Si1).

2. A programmable electronic device according to claim 1, wherein a safety element is provided as a destructible component (Si1; Si2).

3. A programmable electronic device according to claim 1, wherein a safety resistor is provided as a destructible component (Si1; Si2).

4. A reverse polarity protected connection (X; X2; X5) at an electronic unit, wherein said connection (X1; X2; X5) is irreversibly interruptible by disposing a destructible component (Si1; Si2) which is destructible by current overload, directly behind the connection (X1; X2; X5), and by connecting a diode (D3; D4) to ground, viewed from the connection (X1; X2; X5) behind the destructible component (Si1; Si2), which diode has a polarity, so that it blocks under normal correct polarity operation of the connection (X1; X2; X5) wherein a Zener diode (D2) is disposed between the connection (X1; X2) and the destructible component (Si1), which Zener diode has a polarity, so that it blocks when a correct polarity voltage is applied to the connection (X1; X2), and a very high value resistor (R5) branches off to ground between the Zener diode (D2) and the destructible component (Si1).

5. A connection according to claim 4, wherein a safety element is provided as the destructible component (Si1; Si2).

6. A connection according to claim 4, wherein a safety resistor is provided as the destructible component (Si1; Si2).

7. A method for irreversible interruption of connections (X1; X2; X5) configured with reverse polarity protection of an electronic device, wherein they are run through a destructible component (Si1; Si2), destructible by current overload, wherein a diode (D3; D4) branches off to ground after the component (Si1; Si2), which diode has a polarity, so that it blocks under correct polarity normal operation, and that for interrupting the connection (X1; X2; X5) by an intentional and technically permissible polarity reversal of the connection (X1; X2; X5), a current is generated through the diode (D3; D4), which current is so high that the destructible component (Si1; Si2) is destroyed and the connection (X1; X2; X5) is thereby irreversibly interrupted,
wherein a Zener diode (D2) is disposed between the connection (X1; X2) and the destructible component (Si1), which Zener diode has a polarity so that it blocks when a correct polarity voltage is connected to the connection (X1; X2), and a very high value resistor (R5) is connected to ground from the connection between the Zener diode (D2) and the destructible component (Si1), which assures that a voltage, which is reduced by the breakthrough voltage of the Zener diode (D2), is applied to the destructible component (Si1) after its destruction.

8. A method according to claim 7, wherein a safety element is used as the destructible component (Si1).

9. A method according to claim 7, wherein a safety resistor is used as the destructible component (Si1).

10. A method for irreversibly programming an electronic device with at least one programming data connection (X5), which is switched free or switched over by increasing an operating voltage (UB) of at least a portion of the electronic device in order to take over programming data by switching an internal voltage controller (2), which generates the operating voltage (UB) from a higher supply voltage, through applying a higher voltage to an also otherwise voltage carrying polarity reversal protected connection (X1), or by applying an external voltage to a polarity reversal protected output connection (X2), to an operating mode for generating a higher operating voltage (UB), and the electronic device is then programmed by entering suitable data through the programming data connection (X5), wherein said programming is then made irreversible by separating the connection between the connection (X1) or the output connection (X2) and the internal voltage controller (2) by destroying a destructible component (Si1), which is disposed in said connection and is destructible through current overload, by intentional polarity reversal of the connection (X1) or of the output connection (X2), wherein the required strong current is conducted to ground through a diode (D3), branching off after the destructible component (Si1), which diode blocks during correct polarity operation of the connection (X1) or of the output connection (X2), wherein an excessively high voltage at the interrupted destroyed component (Si1) is prevented by the Zener diode (D2) (whose Zener voltage determines the switching point for the programming mode) being disposed between the connection (X1) and the destructible component (Si1), and wherein the respective blocking current is conducted through a high value resistor (R5) to ground, which high value resistor branches off between the component (Si1) and the Zener diode (D2).

11. A method according to claim 10, wherein a safety element is used as the destructible component (Si1; Si2).

12. A method according to claim 10, wherein a safety resistor is used as the destructible component (Si1; Si2).

* * * * *